United States Patent [19]

Yamazaki

[11] Patent Number: 5,098,884
[45] Date of Patent: * Mar. 24, 1992

[54] METHOD FOR PRODUCING A SUPERCONDUCTING PATTERN BY DOPING IMPURITIES

[75] Inventor: Shumpei Yamazaki, Tokyo, Japan

[73] Assignee: Semiconductor Energy Laboratory Co., Ltd., Kanagawa, Japan

[*] Notice: The portion of the term of this patent subsequent to Sep. 24, 2008 has been disclaimed.

[21] Appl. No.: 488,252

[22] Filed: Mar. 5, 1990

Related U.S. Application Data

[62] Division of Ser. No. 176,144, Mar. 31, 1988.

[30] Foreign Application Priority Data

Apr. 15, 1987 [JP] Japan .................................. 62-93732
Apr. 15, 1987 [JP] Japan .................................. 62-93733

[51] Int. Cl.⁵ .......................... B05D 3/06; B05D 5/12
[52] U.S. Cl. ......................................... 505/1; 505/730; 505/742; 427/62; 427/35
[58] Field of Search .................... 505/1, 731, 732, 742, 505/730; 427/62, 63, 35; 250/492.2, 492.3; 437/20

[56] References Cited

U.S. PATENT DOCUMENTS

| | | | |
|---|---|---|---|
| 4,451,303 | 5/1984 | Hiraki et al. | 148/187 |
| 4,697,333 | 10/1987 | Nakahara | 437/20 |
| 4,732,867 | 3/1988 | Schnable | 437/22 |
| 4,758,525 | 7/1988 | Kida et al. | 437/2 |

FOREIGN PATENT DOCUMENTS

01-290526  11/1989  Japan .

OTHER PUBLICATIONS

Koch et al., "Thin Films and Squids Made from YBa$_2$Cu$_3$O$_y$", MRS, Apr. 1987 (Anaheim, CA) pp. 81–84.
Terada et al., "Deposition of Sr$_x$La$_{2-x}$CuO$_{4-y}$ Thin Films by Sputtering", Jpn. J. Appl. Phys., vol. 26(4), Apr. 1987, L508–509.
Tarascon et al., "3d-Metal Doping of the High-Temperature Superconducting Perovskite La-Sr-Cu-O and Y-Ba-Cu-O", Phys. Rev. B, vol. 36(16), Dec. 1987, pp. 8393–8400.
Xiao et al., "Superconductivity and Structure of YBa$_2$(Cu$_{0.9}$A$_{0.1}$)$_3$O$_7$ (A=Ti, V, Cr, Mn, Fe, Co, Ni, Cu, and Zn)$_1$", Reviews of Solid State Science, vol. 1, No. 2(1987), pp. 323–328.
Franck et al., "Supercoductivity in Systems of Composition (M$_x$Y$_{1-x}$)Ba$_2$Cu$_3$O$_{6.5+y}$(M=Al,Ga and Bi)", Reviews of Solid State Science, vol. 1, No. 2 (1987), pp. 405–410.
Gololobov et al., "High-Temperature Superconductivity of Bismuth Strontium Calcium Copper Oxides Doped with Manganese", Vestsi Akad. Navuk BSSR, Ser. Fiz.-Mat. Navuk, (5) 1988, pp. 38–41.

Primary Examiner—Shrive Beck
Assistant Examiner—Roy V. King
Attorney, Agent, or Firm—Sixbey, Friedman, Leedom & Ferguson

[57] ABSTRACT

A superconducting oxide ceramic pattern is described. The pattern is comprised of a high Tc superconducting region and a low Tc superconducting region which exhibits a resistivity at the liquid nitrogen temperature while the high Tc region is superconductive at that temperature. The low Tc region is doped with impurity such as Si and then subjected to thermal treatment to oxidizing the impurity.

7 Claims, 3 Drawing Sheets

METHOD FOR PRODUCING A SUPERCONDUCTING PATTERN BY DOPING IMPURITIES

This is a divisional application of Ser. No. 07/176,144, filed Mar. 31, 1988.

BACKGROUND OF THE INVENTION

This invention relates to the field of superconductor, and more particularly relates to superconducting ceramic pattern and its manufacturing method.

Conventionally, a Nb-Ge metallic material (for example, $Nb_3Ge$) and the like is used as a superconducting material. The application of superconducting materials of this type is limited since a very low temperature is required to make use of superconductivity with such a conventional superconducting material and therefore the driving cost is very high.

In addition, in recent years ceramic materials wich exhibits superconducting properties are known. However, these are also in ingot form and as yet there has been no development of superconducting materials in thin film form.

On the other hand, semiconductor devices provided with a plurality of the elements containing semiconductor integrated circuits within the same substrate are known.

The development of more and more refined semiconductor integrated circuits with high speed action has in recent years become a necessity. Also, along with this refinement a drop in reliability from the heat generated in the semiconductor element and also a reduction in activation speed in the heated parts have become a problem. For this reason, it has been earnestly required to obtain improved structure using superconducting ceramics.

SUMMARY OF THE INVENTION

It is therefore an object of the invention to provide a superconducting pattern which includes low critical temperature regions.

It is another object of the invention to provide a method of selectively lowering the critical temperature of prescribed portions of a superconducting oxide ceramic.

In accordance with the aspect of the invention, the peculier nature of superconducting oxide ceramics is utilized. The inventor has found by experimental that the Tco (at which resistance disappears) of superconducting ceramics can be controlled by doping of impurity while the Tc onset (at which resistivity drop starts) remains with only little change. The doped portions comes to have relatively broad transition temperature region between Tco and Tc onset. Namely, prescribed portions of a superconducting ceramic film can be fransformed into low Tc regions capable of functioning as resistance or active regions at the Tco of the non-doped portions.

In representative cases, superconducting ceramics for use in accordance with the present invention may be prepared consistent with the stoichiometric formula $(A_{1-x}B_x)_yCu_zO_w$, where A is one or more elements of Groups IIIa and Vb of the Periodic Table such as rare earth elements, B is one or more elements of Group IIa of the Periodic Table, e.g., the alkaline earth metals including beryllium and magnesium, and $x = 0.1 - 1$; $y = 2.0 - 4.0$, preferably $2.5 - 3.5$; $z = 1.0 - 4.0$, preferably $1.5 - 3.5$; and $w = 4.0 - 10.0$, preferably $6.0 - 8.0$. Examples of this general formula are $BiSrCaCu_{2-3}O_{4-10}$, $Y_{0.5}Bi_{0.5}Sr_1Ca_1Cu_{2-3}O_{4-10}$, $YBa_2Cu_3O_{6-8}$, $Bi_1Sr_1Mg_{0.5}Ca_{0.5}Cu_{2-3}O_{4-10}$, $Bi_{0.5}Al_{0.5}SrCaCu_{2-3}O_{4-10}$. These material can be formed on a surface by electron beam evaporation, sputtering, photo-enhanced CVD, photo-enhanced PVD, and so forth.

The superconducting ceramic film is deposited on an insulating surface for example by sputtering with 0.1 to 30 microns in thickness. Prescribed portions of the film are removed by photolithography with a mask to leave the remaining portions which are to be active devices such as Josephson devices and passive devices such as resistance, or wiring. The mask is selectively removed from the prescribed portion of the superconducting ceramic film that are desined to be low Tc regions, ion implantation is effected to the superconducting ceramic film through the remining mask to produce low Tc regions. After ion implantation, the superconducting film is subjected to thermal treatment to remedy the damage on the crystalline structure due to the bombardment.

BRIEF DESCRIPTION OF THE INVENTION

FIGS. 1(A), 1(B) and 1(C) are cross sectional views showing the manufacturing process of a first embodiment of the present invention.

DETAILED DESCRIPTION OF THE PREFERRED EMBODIMENTS

Figure 1A:
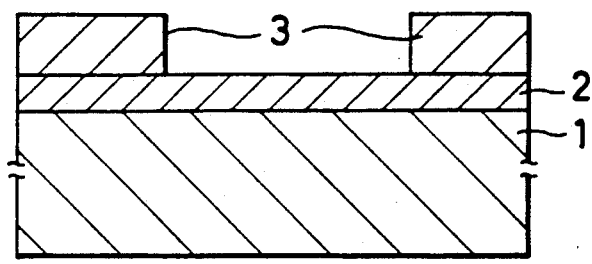
Figure 1B:
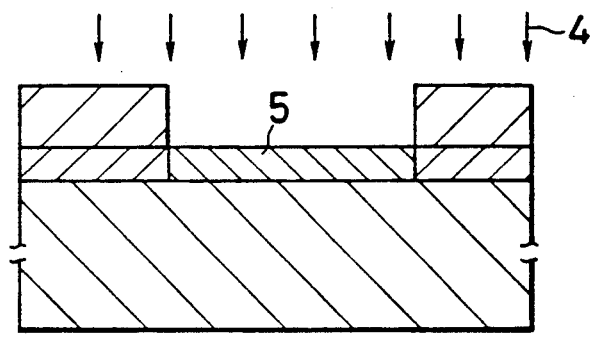
Figure 1C:
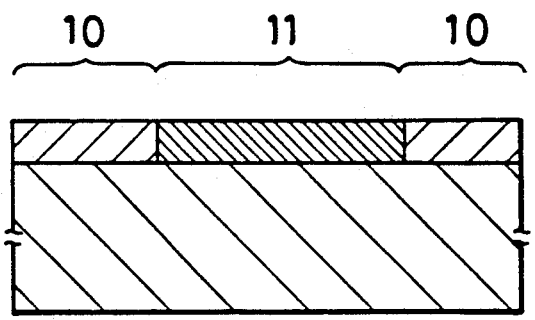

Referring to FIGS. 1(A) to 1(C), a method of manufacturing superconducting ceramic pattern in accordance with the present invention will be described. In FIG. 1(A), an oxide ceramic thin film 2 is deposited with 0.1 to 1.0 micron in thickness on an insulating single crystalline substrate 1 made of $SrTiO_3$ by low frequency sputtering with a target whose composition is chosen so that the deposited film can be grown into a thin film conforming to the stoichiometric formula $(YBa_2)Cu_3O_{6-8}$. The substrate is heated in an argon-oxygen atmosphere at 700°–1000° C., e.g. 850° C. during sputtering. The deposition condition (including the preparation of the target composition) is controlled to keep not more than 100 ppm, preferably no more than 10 ppm the abundance of the impurity (Si) contained in the deposited ceramic film 2 that is to be added intentionally to the ceramic film in the following process.

Figure 3:
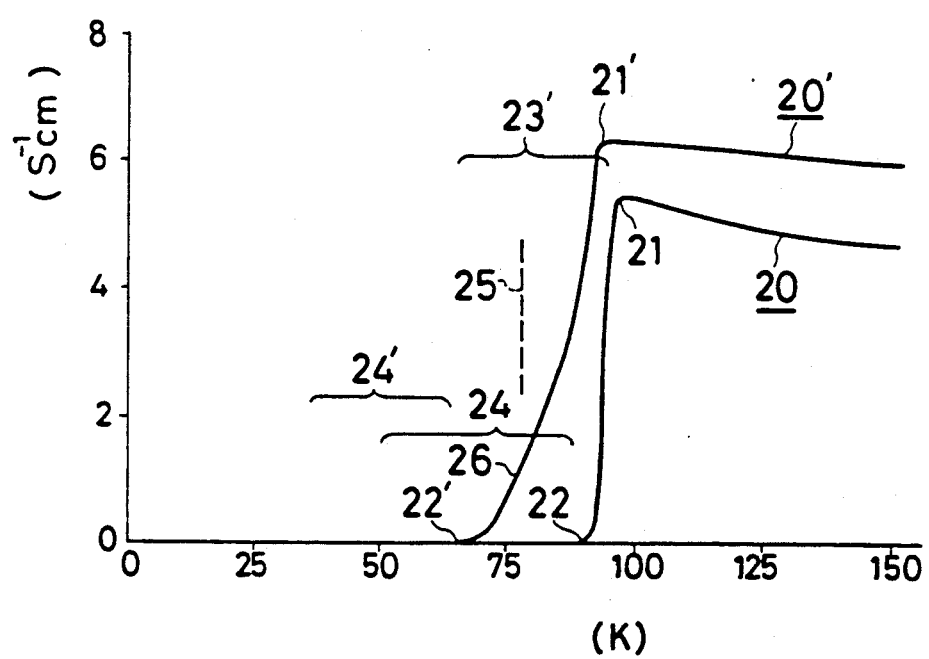
FIG. 3 is graphical diagram showing the relationship between the resistivity and the temperature of superconducting ceramics in accordance with the present invention.

After the completion of sputtering, the ceramic thin film 2 is fired at 800°–1000° C. for 5-50 hours in an oxidizing atmosphere in order to transform the ceramic film into a superconducting single crystalline ceramic film. A curve 20 plotted in FIG. 3 shows the temperature-resistivity relation of the fired ceramic film 1 in accordance with experimental. As shown in the curve, there appears a transition region 23 between Tco 22 at which the resistivity vanishes and Tc onset 21 at which the resistivity starts sharp drop.

Then, a portion 5 of the superconducting ceramic film 2 is doped with silicon by ion implantation through a photoresist mask 3 covering the film 2 (FIG. 1(B)). The impurity density is $5 \times 10^{15}$ to $2 \times 10^{22}$ atom/cm$^3$, e.g. $5 \times 10^{19}$ atom/cm$^3$. Thereafter, the ceramic film 2 is fired again at 700°–1000° C. in an oxidizing atmosphere. This thermal treatment causes the oxidation of the impurity, and therefore lowers the Tc. The resist 3 comes off at the same time in the forms of carbon dioxide and water while a portion of the silicon in the ceramic film is oxidized so that the superconducting ceramic contains silicon oxide at 0.1%. The doped portion 11 of the superconducting ceramic film contains the main composition (equal to that of the undeped portion) at about 99%. The resistivity-temperature relation of the superconducting ceramic film was changed according to experimental from the curve 20 to a curve 20' by the doping process. As seen from the curve 20', the Tco was shifted to a lower temperature 22' while the Tc onset was not changed so much. Eventually, the transition region 23' became broad in the doped portion. In this case, the superconducting ceramic film was in a transition condition with a definite resistivity 26 at the temperature 25 of liquid nitrogen. The shift of the critical temperature can be controlled by adjusting the amount of the doping. The doped portion 11 holded the relatively low Tco' even after being subjected to a high temperature of 700°–1000° C. during the subsequent process.

Examples of other impurities to be added to superconducting ceramics are Al, Mg, Ga, Ge, Ti, Zr, Fe, Ni, Co, B and P. A plurality of impurities may be used in combination. The doping level should be chosen higher than the level already occuring in the ceramic film, or such an impurity that does not occur in the film may be added to the film.

Figure 2:
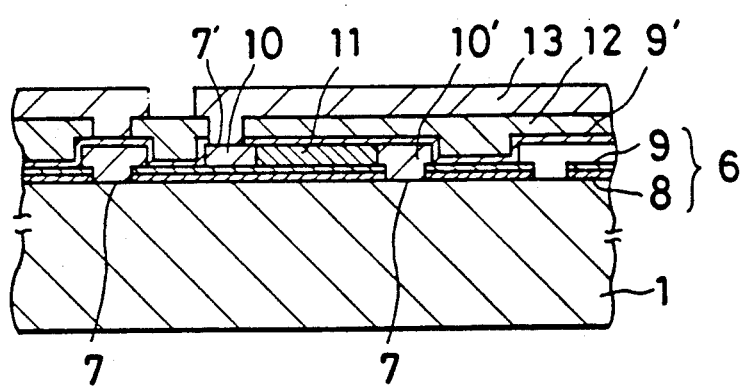
FIG. 2 is a cross sectional view showing a second embodiment of the present invention.

Referring now to FIG. 2, another patterm manufactured in accordance with the present invention will be explained. Within a semiconductor substrate 1 is formed transistors or other devices in advance. A first insulating film 6 is formed and patterned on the upper surface of the substrate 1. The insulating film 6 consists of an underlying film 8 made of silicon oxide and an overlying film 9 made of silicon nitride To provide a superconducting circuit on the substrate 1, a superconducting oxide ceramic film is deposited on the substrate 1 over the insulating film 6 by sputtering as in the foregoing embodiment and patterned by photolithography. Then, prescribed portions of the ceramic film are doped with ion impurity in the same way as explained above to produce superconducting wiring 10 and 10' and low Tc regions 11 which can be selectively used as resistances or active regions at the liquid nitrogen temperature. In this second embodiment, the ceramic film is subjected to high temperatures at a lower degree than in the preceding embodiment so that the superconducting ceramic pattern has finally a polycrystalline structure. The devices within the semiconductor substrate are interconnected by the superconducting pattern. The manufacture condition is desinged so that the doped regions have a definite resistivity while nondoped regions are superconducting at the liquid nitrogen temperature.

A second insulating film 9' is formed on the substrate 1 over the deposited films thereon together with another insulating film 12 which fills the depressions formed by preceding deposition and provides an even upper surface. Openings 7' are formed on the insulating films 9' and 12 by photolithography. Over the insulating films 9' and 12 is deposited a second superconducting ceramic film 13' by the same process as used in the first embodiment. The second superconducting ceramic film is patterned by photolithography. The first and the second superconducting ceramic films interconnect through the openings 7'.

When the ceramic film is deposited and then transformed into the desired superconducting film by firing, the ion implantation may be effected the ceramic film prior to the transformation. In this case, the formation of the low Tc region and the high Tc region is completed after the firing.

The above devices including superconducting patterns in accordance with the present invention is designed to operate at the liquid nitrogen temperature. However, depending on the possible future development, it may be possible to construct a superconducting ceramic film having a more higher critical temperature such as the dry ice temperature. The present invention can be easily applied to that case by simply replacing the superconducting formation process by the maybe developed process. Also, although in the above description the doped region of the superconducting ceramic film remains yet as a superconducting material, it is not necessarily superconducting but may be normal conducting. Namely, the doping in accordance with the present invention can be effected to destroy the superconducting structure.

Although, in the above description, a semiconductor substrate provided with active devices therein, a cramic substrate coated with a non-oxide film such as a 50 to 5000 Å thick silicon nitride on its upper surface may be used. For example a YSZ (yttrium stabilized zircon) substrate is used instead which has a coefficient of thermal expansion substantially same as the ceramic.

Superconducting ceramics for use in accordance with the present invention also may be prepared in consistence with the stoichiometric formulae $(A_{1-x}B_x)_yCu_zO_w$, where A is one or more elements of Group IIIa of the Periodic Table, e.g., the rare earth elements, B is one or more elements of Group IIa of the Periodic Table, e.g., the alkaline earth metals including beryllium and magnesium, and $x=0-1$; $y=2.0-4.0$, preferably 2.5–3.5; $z=1.0-4.0$, preferably 1.5–3.5; and $w=4.0-10.0$, preferably 6.0–8.0. One example is $YBa_2Cu_3O_{6-8}$. Also, superconducting ceramics for use in accordance with the present invention may be prepared consistent with the stoichiometric formulae $(A_{1-x}B_x)_yCu_zO_w$, where A is one or more elements of Group Vb of the Periodic Table such as Bi, Sb and As, B is one or more elements of Group IIa of the Periodic Table, e.g., the alkaline earth metals including beryllium and magnesium, and $x=0.3-1$; $y=2.0-4.0$, preferably 2.5–3.5; $z=1.0-4.0$, preferably 1.5–3.5; and $w=4.0-10.0$, preferably 6.0–8.0. Examples of this general formula are $BiSrCaCuCu_2O_x$ and $Bi_4Sr_3Ca_3Cu_4O_x$. Tc onset and Tco samples confirmed consistent with the formula $Bi_4Sr_yCa_3Cu_4O_x$ (y is around 1.5) were measured to be 40°–60° K, which is not so high. Relatively high critical temperatures were obtained with samples conforming to the stoichiometric formulae $Bi_4Sr_4Ca_2Cu_4O_x$ and $Bi_2Sr_3Ca_2Cu_2O_x$. The number designating the oxygen proportion is 6–10, e.g. around 8.1.

While a description has been made for several embodiments, the present invention should be limited only by the appended claims and should not be limited by the particular examples. For example, superconducting cramics can be formed by MBE (Electron Beam Epitaxial Growth), vapor phase method, printing and so forth instead of sputtering.

I claim:

1. A method of producing a superconducting oxide ceramic pattern comprising:

forming a ceramic film on a surface of a substrate; and
   converting said ceramic film to a ceramic superconductive film;
   doping a portion of said ceramic film with an impurity by using a mask where the doping can occur either before or after the conversion of the ceramic film to the ceramic superconducting film, said impurity comprising one or more selected from the group consisting of Si, Al, Mg, Ga, Ge, Ti, Zr, Fe, Ni, Co, B and P; so that the TcO of the doped portion is lowered by said step of doping.

2. The method of claim 1 wherein the doping level is selected higher than the initial corresponding impurity level of said ceramic film.

3. The method of claim 2 wherein the formation of said ceramic film is carried out so that said initial impurity level is limited not higher than 100 ppm.

4. The method of claim 1 further comprising the step of thermal annealing in an oxidizing atmosphere after the doping.

5. The method of claim 1 wherein the formation of said ceramic film is implemented by sputtering.

6. The method of claim 1 wherein the formation of said ceramic film is implemented by printing, MBE growth of vapor phase method.

7. A method of producing a superconducting oxide ceramic pattern comprising:

forming a ceramic film on a surface of a substrate; and
   converting said ceramic film to a ceramic superconductive film;
   doping a portion of said ceramic film with an impurity by using a mask where the doping can occur either before or after the conversion of the ceramic film to the ceramic superconducting film, said impurity comprising one or more selected from the group consisting of Si, Al, Mg, Ga, Ge, Ti, Zr, Fe, Ni, Co, B and P; so that the superconductivity of the doped portion is destroyed by said impurities.

* * * * *